(12) United States Patent
Legall et al.

(10) Patent No.: US 10,530,293 B2
(45) Date of Patent: Jan. 7, 2020

(54) FASTENING STAPLE FOR A PHOTOVOLTAIC FRAMEWORK WITH MOUNTING BY INSERTION AND THEN SLIDING INTO A SLOT OF A SUPPORT WALL

(71) Applicant: A. RAYMOND ET CIE, Grenoble (FR)

(72) Inventors: Antoine Legall, Fontaine (FR); Emmanuel Turlot, Grenoble (FR); Jean-Baptiste Chevrier, Saint Vincent de Mercuze (FR)

(73) Assignee: A. RAYMOND ET CIE, Grenoble (FR)

( * ) Notice: Subject to any disclaimer, the term of this patent is extended or adjusted under 35 U.S.C. 154(b) by 0 days.

(21) Appl. No.: 16/374,357

(22) Filed: Apr. 3, 2019

(65) Prior Publication Data

US 2019/0312546 A1    Oct. 10, 2019

(30) Foreign Application Priority Data

Apr. 4, 2018    (FR) ...................... 18 52910

(51) Int. Cl.
*H02S 30/10* (2014.01)
*F24S 25/63* (2018.01)
*H01L 31/042* (2014.01)

(52) U.S. Cl.
CPC .............. *H02S 30/10* (2014.12); *F24S 25/63* (2018.05); *H01L 31/042* (2013.01)

(58) Field of Classification Search
USPC ........................................................ 248/300
See application file for complete search history.

(56) References Cited

U.S. PATENT DOCUMENTS

| 3,298,646 A | 1/1967 | Buren, Jr. | |
| 4,571,013 A * | 2/1986 | Suffi | ......................... H01R 4/64 |
| | | | 439/393 |

(Continued)

FOREIGN PATENT DOCUMENTS

| DE | 102010029820 A1 | 7/2011 |
| EP | 2867541 | 5/2015 |

(Continued)

*Primary Examiner* — Monica E Millner
(74) *Attorney, Agent, or Firm* — Cantor Colburn LLP

(57) ABSTRACT

A fastening staple adapted for fastening of a photovoltaic framework against a front face of a support wall comprises a bearing head and a counter-support foot constituting a jaw likely to transversely receive both a segment of the support wall and a segment of the photovoltaic framework. The counter-support foot comprises at least one bearing lateral flange positioned longitudinally so as to bear longitudinally against a rear face of the support wall when the photovoltaic framework and the support wall are transversely engaged in the jaw. The bearing head comprises at least one hooking element adapted to hook the photovoltaic framework in order to transversely immobilize the photovoltaic framework in the jaw. The bearing head and/or the counter-support foot comprises at least one mechanical tensioning flange where an elastic deformation and/or a displacement thereof, resulting from the action of transverse engagement of the photovoltaic framework segment and of the support wall segment in the determined interval between the bearing head and the counter-support foot, enables the bearing head and the counter-support foot to exert a longitudinal tightening of the photovoltaic framework and of the support wall in the jaw.

20 Claims, 6 Drawing Sheets

(56) References Cited

U.S. PATENT DOCUMENTS

| | | | | |
|---|---|---|---|---|
| 8,590,223 B2* | 11/2013 | Kilgore | ................... | H01R 4/26 |
| | | | | 52/173.3 |
| 9,035,176 B2* | 5/2015 | Keller | ...................... | H01R 4/64 |
| | | | | 174/51 |
| 9,850,934 B2* | 12/2017 | Schulz | .................. | F16B 5/0642 |
| 10,202,995 B2* | 2/2019 | Stickelberger | ............ | F16B 2/22 |
| 2006/0102820 A1 | 5/2006 | Boville | | |
| 2015/0263666 A1* | 9/2015 | Powers, III | .......... | F24S 25/636 |
| | | | | 136/251 |
| 2015/0311854 A1* | 10/2015 | Goehringer | ............. | H02S 20/00 |
| | | | | 211/41.1 |
| 2017/0033730 A1* | 2/2017 | Almy | ...................... | H02S 20/23 |
| 2019/0154306 A1* | 5/2019 | Rothschild | ............ | F24S 25/634 |
| 2019/0186518 A1* | 6/2019 | Legall | ................... | F24S 25/632 |

FOREIGN PATENT DOCUMENTS

| | | |
|---|---|---|
| WO | 2012167895 A1 | 12/2012 |
| WO | 2014008087 A2 | 1/2014 |

\* cited by examiner

FASTENING STAPLE FOR A PHOTOVOLTAIC FRAMEWORK WITH MOUNTING BY INSERTION AND THEN SLIDING INTO A SLOT OF A SUPPORT WALL

CROSS REFERENCE TO RELATED APPLICATIONS

This application claims priority under 35 U.S.C. § 119 to following French Patent Application No. 18/52910, filed on Apr. 4, 2018, the entire contents of which are incorporated herein by reference thereto.

TECHNICAL FIELD

The present invention concerns a fastening staple adapted for fastening of a photovoltaic framework against a front face of a support wall.

A targeted possible application concerns that where the support wall is constituted by any of the flanges of a supporting beam which, in turn, is intended to be held away from the ground by means of any pedestal adapted to the supporting beam and to the terrain.

PRIOR STATE OF THE ART

It is a known problem to have to fasten each of the photovoltaic frameworks of a photovoltaic installation on one or several supporting beam(s). A known technique consists in using a plurality of fastening staples to hold each photovoltaic framework, where each fastening staple allows holding the photovoltaic framework with which it cooperates against a front face of a support wall delimited by one of the supporting beams.

It is also known that, in order to meet some regulatory requirements, a fastening staple must be capable of setting at the same electric potential the photovoltaic framework and the support wall.

As example, the document EP-A1-2867541 in the name of the applicant describes an apparatus for fastening a photovoltaic framework comprising a fastening element integrally made in one piece to link the photovoltaic framework to an elongate support. The fastening element comprises a body including a pair of slots enabling the reception of a photovoltaic framework segment, a pair of flexible flanges to clip into the elongate support which has a U-shaped hollow section inside which the body is housed at the time of clipping of the flexible flanges, and a flexible tab arranged in the top portion of the body so as to cut into the photovoltaic framework in order to immobilize it inside the slots.

Even though this solution is effective with regards to the robustness of the obtained attachment, a drawback remains in that the only possibility of setting at the time of mounting lies in the capacity of adjustment of the position occupied by each fastening element along each of the elongate supports. This results in difficulties in mounting and also the photovoltaic installation can be implanted only on substantially flat terrains, which is limiting for the development thereof.

Besides addressing the above-mentioned problem, additional difficulties consist in obtaining fastening staples which are easy to implement for the installer, which are inexpensive for obvious reasons relating to costs, and which confer a very high resistance to the attachment ensured thereby regardless of the tearing out forces which may reach 120 kg per fastening staple or to shear forces which may also be high.

These problems of resistance to tearing out and to shear becomes even more complex to manage because of the current tendency which consists in developing even larger photovoltaic frameworks in order to reduce the mounting costs of the photovoltaic installations.

Like those described in the documents US2006/102820A1 and U.S. Pat. No. 3,298,646A, there are solutions implementing a fastening staple containing a bearing head and a counter-support foot linked to each other by a body so as to define a jaw. But these solutions do not concern the field of fastening photovoltaic panels and do not have a sufficient robustness to addresses the needs in terms of resistance to tearing out and to shear.

DISCLOSURE OF THE INVENTION

The present invention aims at providing a fastening staple adapted for fastening of a photovoltaic framework against a front face of a support wall which addresses the above-mentioned problems in connection with the prior art.

In particular, an object of the invention is to provide a fastening staple which meets at least one of the following objectives:

being economical,
promoting easy mounting,
making possible installations on non-flat terrains,
being very robust to tearing out and to shear.

This object may be achieved thanks to a fastening staple adapted for fastening of a photovoltaic framework against a front face of a support wall, the fastening staple consisting of an electrically-conductive metallic part integrally made in one piece shaped so as to delimit:

a bearing head;
a counter-support foot;
a linking body linking the counter-support foot to the bearing head so that the bearing head and the counter-support foot are shifted from each other along a longitudinal direction of the fastening staple by a determined interval, the linking body being adapted to cross the thickness of the support wall through a slot formed in the support wall, by longitudinal insertion of the bearing head through the slot so as to position the bearing head and the counter-support foot respectively on either side of the support wall, and to slide along the slot by an overall sliding movement of the fastening staple in a transverse direction of the fastening staple;
a fastening staple wherein the determined interval between the bearing head and the counter-support foot is adapted such that the bearing head and the counter-support foot constitute a jaw likely to transversely receive both a segment of the support wall and a segment of the photovoltaic framework in a configuration where the photovoltaic framework bears against the front face of the support wall,
wherein the counter-support foot comprises at least one bearing lateral flange positioned longitudinally so as to bear longitudinally against a rear face of the support wall when the photovoltaic framework and the support wall are transversely engaged in the jaw,
wherein the bearing head comprises at least one hooking element adapted to hook the photovoltaic framework in order to transversely immobilize the photovoltaic framework in the jaw,
wherein the bearing head and/or the counter-support foot comprises at least one mechanical tensioning flange where an elastic deformation and/or a displacement thereof, resulting from the action of transverse engagement of the photovoltaic framework segment and of the support wall segment in the determined interval between the bearing head and the counter-support foot, enables the bearing head and the counter-support foot to exert a longitudinal tightening of the photovoltaic framework and of the support wall in the jaw, wherein the linking body is constituted by two lateral walls delimited by the fastening staple, shifted from each other in a lateral direction of the fastening staple and connected to each other at one of their longitudinal ends at the bearing head by a folding area, their opposite longitudinal ends being independent of each other at the counter-support foot, said at least one bearing lateral flange being secured to one of the lateral walls so as to extend laterally in projection with respect to the lateral wall to which it is secured.

Some preferred but non-limiting aspects of this fastening staple are the following ones.

The bearing head may comprise an upper arm extending transversely in a cantilevered manner from the folding area and directly below the counter-support foot in the longitudinal direction.

Said at least one mechanical tensioning flange may be constituted by said at least one bearing lateral flange and said at least one bearing lateral flange is inclined so as to form an angle with respect to the lateral direction and is connected to the lateral wall to which it is secured by an elastically-deformable curved area such that the bearing lateral flange is likely to come down longitudinally, at least by elastic deformation of said elastically-deformable curved area, under the action of the transverse engagement of the photovoltaic framework segment and of the support wall segment in the determined interval between the bearing head and the counter-support foot.

Each of the bearing lateral flanges may be split in the transverse direction into at least one upper bearing lateral flange and into at least one lower bearing lateral flange, said at least one upper bearing lateral flange projecting on the bearing head side, in the longitudinal direction, with respect to said at least one lower bearing lateral flange.

The hooking element may comprise a retaining lug and a shoulder secured to the upper arm while being shifted from each other in the transverse direction along the upper arm, and delimiting therebetween a notch which opens onto the inside of the jaw and adapted to receive a rib of the photovoltaic framework.

The lateral walls may be inclined so as to form an angle with the longitudinal direction so as to get close to each other by getting close to the folding area, the lateral walls being likely to laterally approach each other by elastic deformation of the folding area, the elastic return of the material of the folding area ensuring a lateral return of the lateral walls outwardly in the lateral direction.

Each lateral wall may comprise a holding lateral projection likely to abut against the front face of the support wall, at the edges of the slot, after the longitudinal insertion of the bearing head through the slot.

The bearing head may comprise two flexible flanges independent of each other where each flexible flange is connected to the upper arm by a folded area so as to extend each towards the counter-support foot in an inclined manner by forming an angle with the longitudinal direction, the two flexible flanges converging towards each other by getting close to the upper arm, each flexible flange being likely to be separated laterally, by elastic deformation of said folded area and/or by intrinsic elastic deformation of the flexible flange, under the action of the transverse engagement of the photovoltaic framework segment and of the support wall segment in the determined interval between the bearing head and the counter-support foot and said at least one mechanical tensioning flange is constituted by the two flexible flanges.

The hooking element may comprise a series of hooking teeth transversely staggered along a distal edge of the flexible flange opposite to its proximal edge linked to the folded area, the hooking teeth being adapted to cut into the photovoltaic framework segment under the action of the transverse engagement of the photovoltaic framework segment in the determined interval between the bearing head and the counter-support foot.

There is also provided a photovoltaic installation comprising at least one photovoltaic framework, at least one support wall delimiting a front face against which bears the photovoltaic framework and in which is formed at least one slot, and at least one such fastening staple inserted into the slot so that the linking body crosses the thickness of the support wall through the slot to position the bearing head and the counter-support foot respectively on either side of the support wall, and slid along the slot by an overall sliding movement of the fastening staple in the transverse direction of the fastening staple to transversely engage both a segment of the support wall and a segment of the photovoltaic framework in the determined interval between the bearing head and the counter-support foot.

BRIEF DESCRIPTION OF THE DRAWINGS

Other aspects, objects, advantages and features of the invention will appear better on reading the following detailed description of preferred embodiments thereof, provided as a non-limiting example, and made with reference to the appended drawings in which.

DETAILED DISCLOSURE OF PARTICULAR EMBODIMENTS

Figure 1:
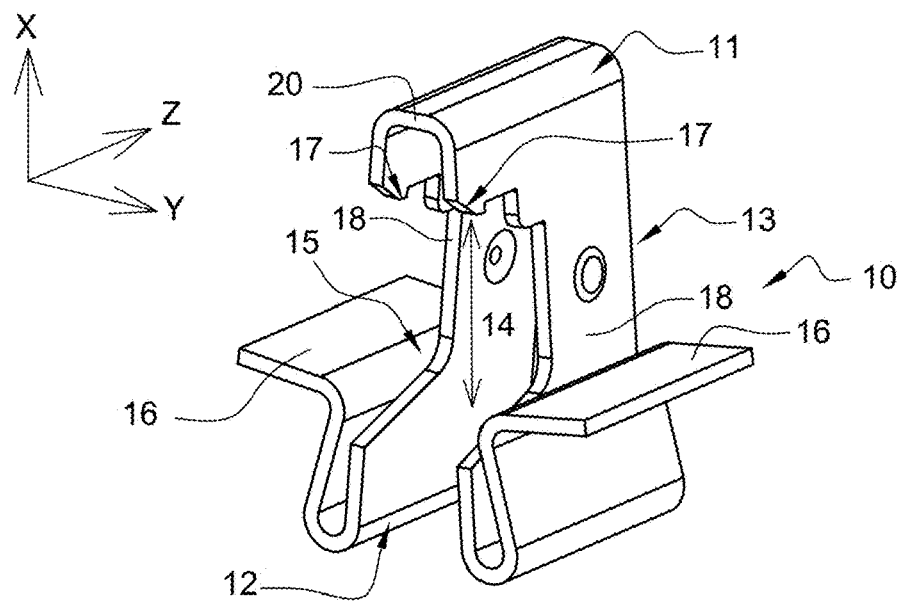
FIGS. 1 and 2 illustrate respectively in front and rear perspective views a first example of a fastening staple according to the invention.

In FIGS. 1 to 14 and in the following description, the same reference numerals represent identical or similar elements. Moreover, the different embodiments and variants do not exclude each other and may be combined together.

Figure 2:
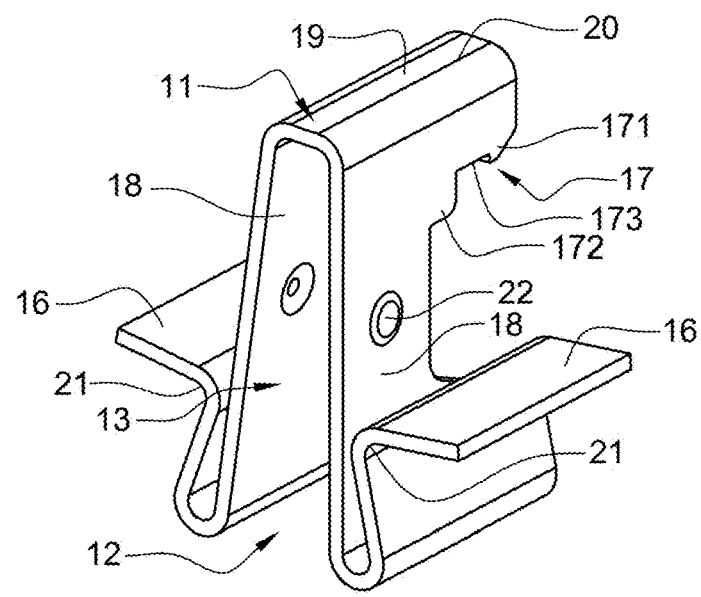
Figure 7:
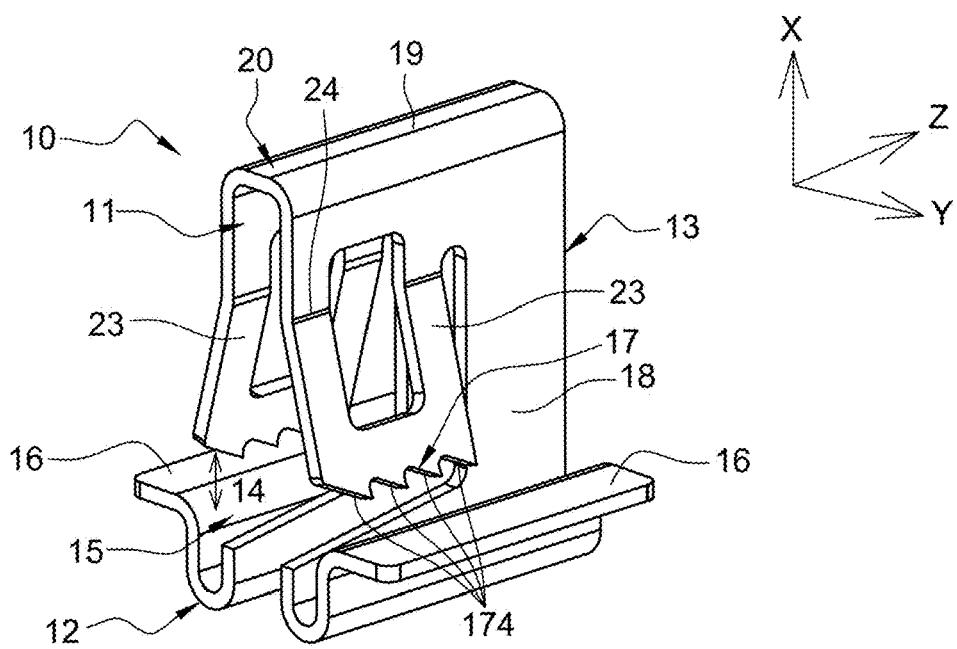
Figure 11:
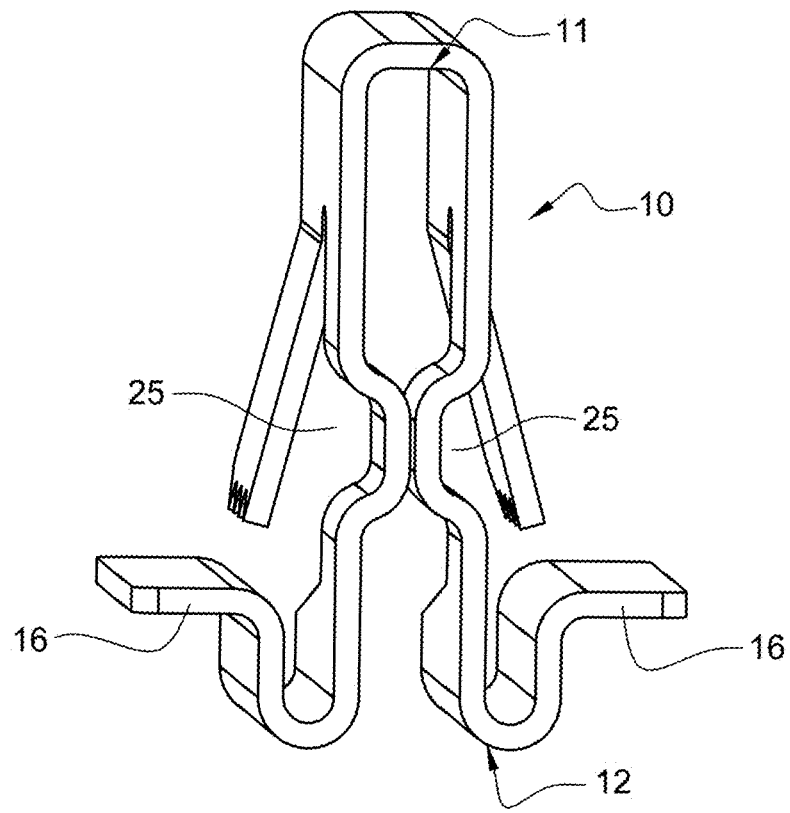
FIG. 11 illustrates in rear perspective view a third example of a fastening staple according to the invention.
Figure 12:
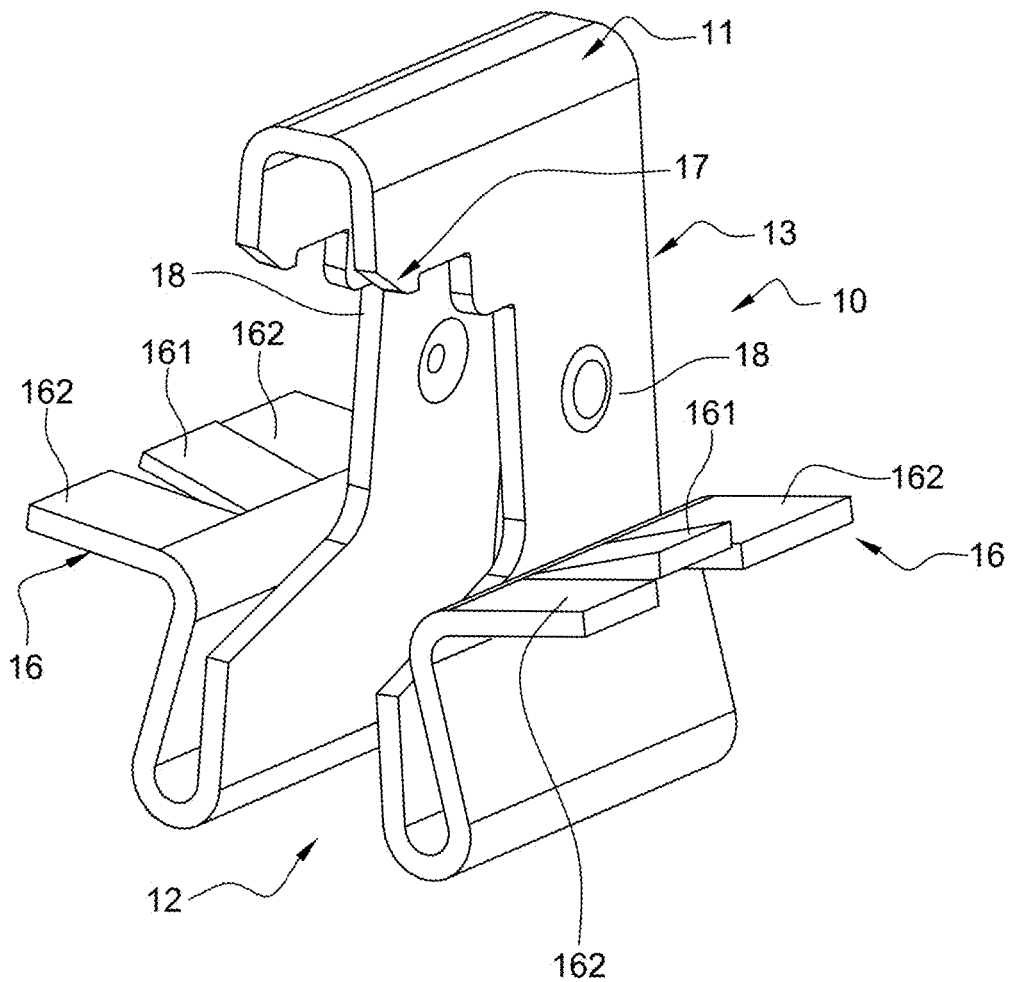
FIG. 12 illustrates in front perspective view a fourth example of a fastening staple according to the invention.
Figure 13:
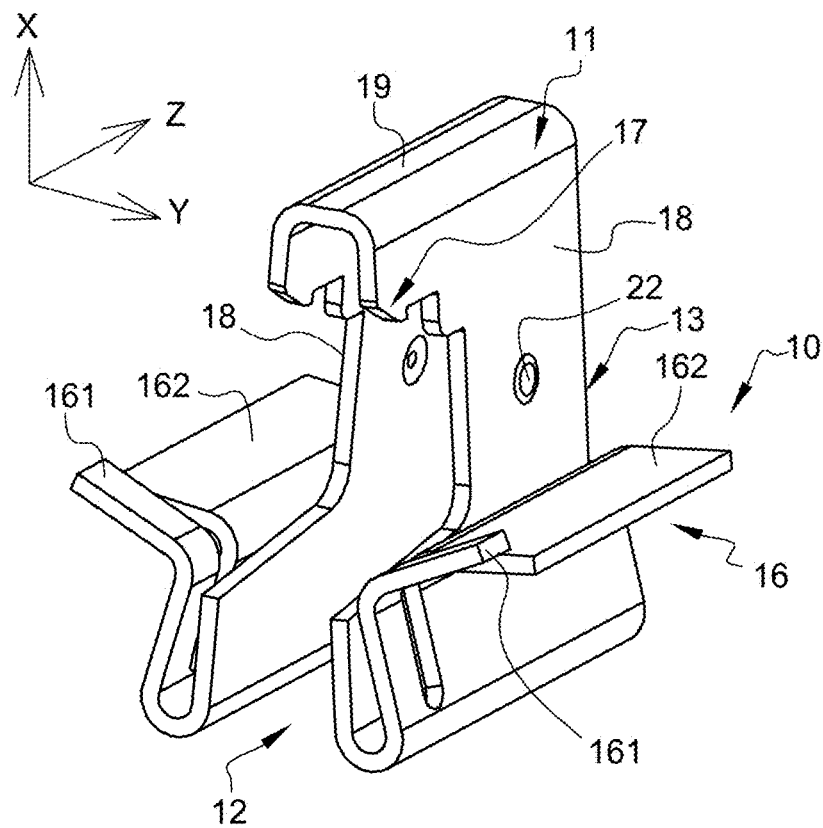
FIG. 13 illustrates in front perspective view a fifth example of a fastening staple according to the invention.
Figure 14:
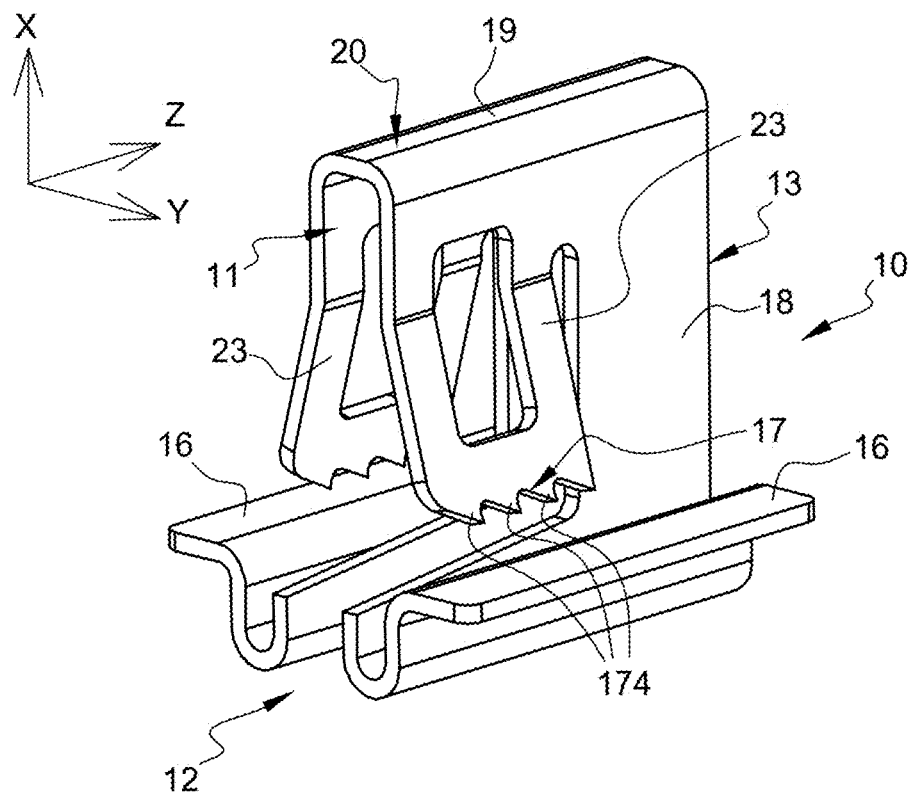
FIG. 14 illustrates in front perspective view a sixth example of a fastening staple according to the invention.

FIGS. 1 and 2 represent a first example of a fastening staple 10 according to the invention. FIG. 7 represents a second example of a fastening staple 10 according to the invention. FIG. 11 represents a third example of a fastening staple 10 according to the invention. FIG. 12 represents a fourth example of a fastening staple. FIG. 13 represents a fifth example of a fastening staple 10 according to the invention, which is a variant of that of FIG. 12. FIG. 14 represents a sixth example of a fastening staple 10 according to the invention, which is a variant of that of FIG. 7. The remaining figures show the manner in which the fastening staples 10 of the first two examples are used in operation.

Each fastening staple 10 allows, on the one hand, holding a photovoltaic framework 100 with which it cooperates against a front face of a support wall 201, and on the other hand, setting at the same electric potential the photovoltaic framework 100 and the support wall 201.

As it can be noticed in FIGS. 3 to 6 and 8 to 10, the support wall 201 may in particular be constituted by one of the flanges of a supporting beam 200 which, in turn, is intended to be held away from the ground by means of any pedestal (not represented) adapted to the supporting beam 220 and the terrain. Nonetheless, the nature of the system in which the support wall 201 is arranged is not limiting and this system may be arbitrary, depending on the applications.

A photovoltaic installation is intended to comprise a plurality of photovoltaic framework 100. For example, each photovoltaic framework 100 is held bearing against a first support wall 201 secured to a first supporting beam 200 by means of at least two fastening staples 10 shifted along this first supporting beam 200 and against a second support wall 201 secured to a second supporting beam 200 by means of at least two additional fastening staples 10 shifted along this second supporting beam 200.

In FIGS. 5, 6, 9 and 10, only one portion of the photovoltaic structural frame or framework 100 is represented. In particular, this structural frame portion may be in the form of a metallic profile, whose section differs between the embodiment of FIGS. 5 and 6 and the embodiment of FIGS. 9 and 10. It is specified that the photovoltaic framework 100 is not actually limited per se with regards to the diversity of application fields that may be considered with respect to the nature of the photovoltaic frameworks 100 which may be held in place by the fastening staples 10 described in this document. On the contrary, the photovoltaic frameworks 100 fastened thanks to these fastening staples 10 may have large dimensions where necessary, for example a width comprised between 1 m and 1.5 m and a length comprised between 1.5 m and 2.5 m, which is a real advantage in terms of cost and ease of installation.

Each of the fastening staples 10 of FIGS. 1 to 11 is a part formed in an electrically-conductive metallic material. For example, it may result from an operation of cutting a pattern from a sheet metal or band of said electrically-conductive metallic material, and then from successive operations of folding this pattern until obtaining the final shape of the fastening staple 10. Thus, each fastening staple 10 is shaped so as to delimit a bearing head 11, a counter-support foot 12 and a linking body 13 linking the counter-support foot 12 to the bearing head 11.

The manner in which the fastening staple 10 is shaped is such that the bearing head 11 and the counter-support foot 12 are shifted from each other along a longitudinal direction X of the fastening staple 10 by a determined interval 14.

For clarity reasons, there is associated an orthogonal reference framework to each fastening staple 10 including the longitudinal direction X as mentioned hereinbefore, a lateral direction Y and a transverse direction Z.

The linking body 13 is adapted to cross the thickness of the support wall 201 throughout the thickness of a slot 202 formed in the support wall 201, by insertion of the bearing head 11 through the slot 202 in the longitudinal direction X to position the bearing head 11 and the counter-support foot 12 respectively on either side of the support wall 201.

Figure 3:
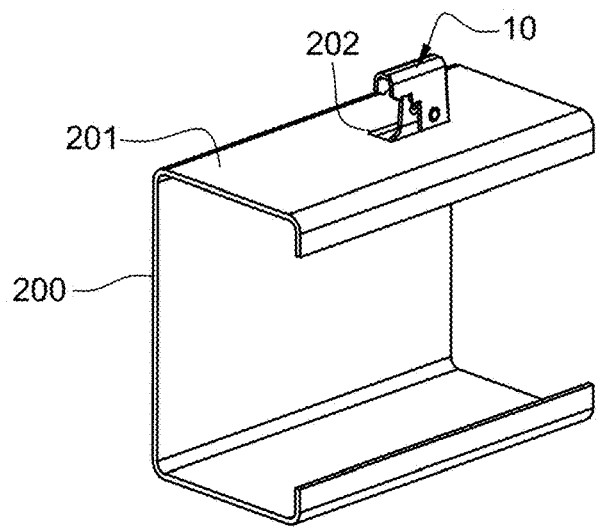
FIGS. 3 and 4 show the fastening staple of FIGS. 1 and 2 in the mounted state on a support wall by insertion through a slot.
Figure 4:
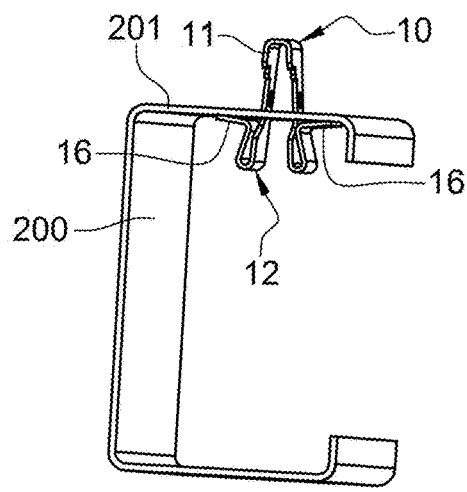
Figure 8:
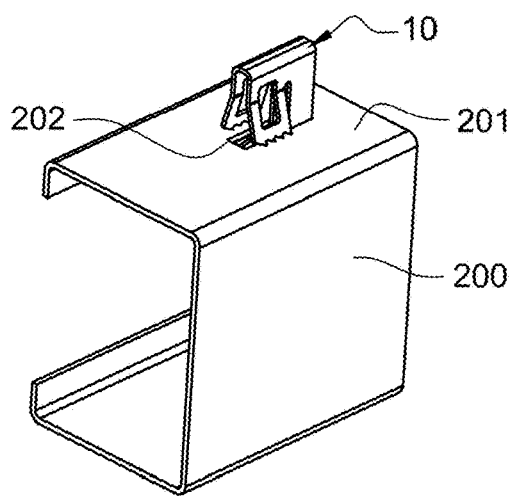
FIGS. 8 and 9 show the fastening staple of FIG. 7 in the mounted state on a support wall by insertion through a slot.
Figure 9:
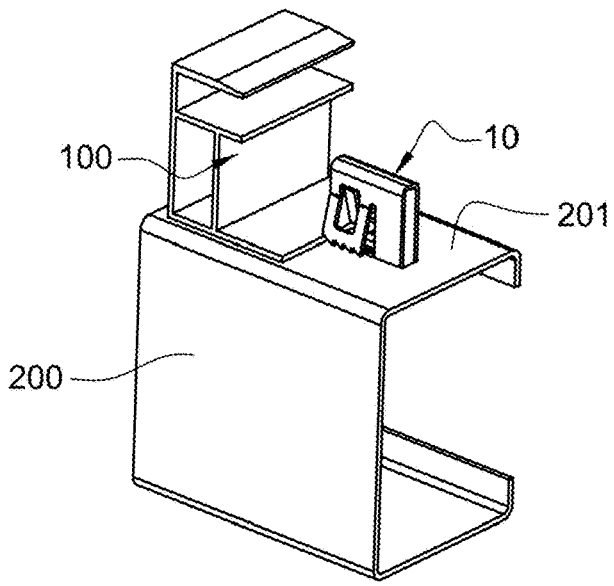

For example, FIGS. 3 and 4 for the first example of a fastening staple 10 and FIG. 8 for the second example of a fastening staple 10 illustrate the situation obtained on completion of the longitudinal insertion of the bearing head 11 throughout the thickness of the slot 202. The bearing head 11 is located at the front of the front face of the support wall 201 whereas the counter-support foot 12 is located at the rear of the rear face of the support wall 201.

The linking body 13 is also adapted to slide, once it has been inserted beforehand longitudinally in the manner described in the previous paragraph, over all or part of the length of the slot 202 by an overall sliding movement of the fastening staple 10 in the transverse direction Z of the fastening staple 10.

Advantageously, the length of the slot 202 is smaller than the dimension of the fastening staple 10 in the transverse direction, the difference between these two dimensions being adjusted and intentionally large enough in order to enable a possibility of setting the position occupied by the photovoltaic framework 100 with respect to the support wall 201 according to a given direction, typically oriented according to an East-West axis. This promotes the implantation of the photovoltaic installation on a non-flat terrain.

The determined interval 14 between the bearing head 11 and the counter-support foot 12 is adapted such that the bearing head 11 and the counter-support foot 12 constitute a jaw 15 likely to transversely receive both a segment of the support wall 201 and a segment of the photovoltaic framework 100 in a configuration where the photovoltaic framework 100 bears against the front face of the support wall 201.

Figure 5:
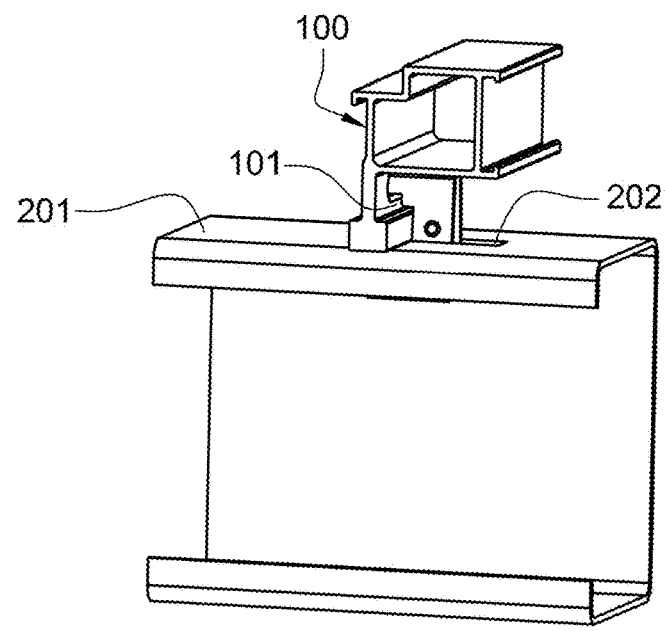
FIGS. 5 and 6 show the fastening staple of FIGS. 1 to 4, after sliding so as to occupy a state where it ensures holding of a photovoltaic framework, FIG. 7 illustrate in front perspective view a second example of a fastening staple according to the invention.
Figure 6:
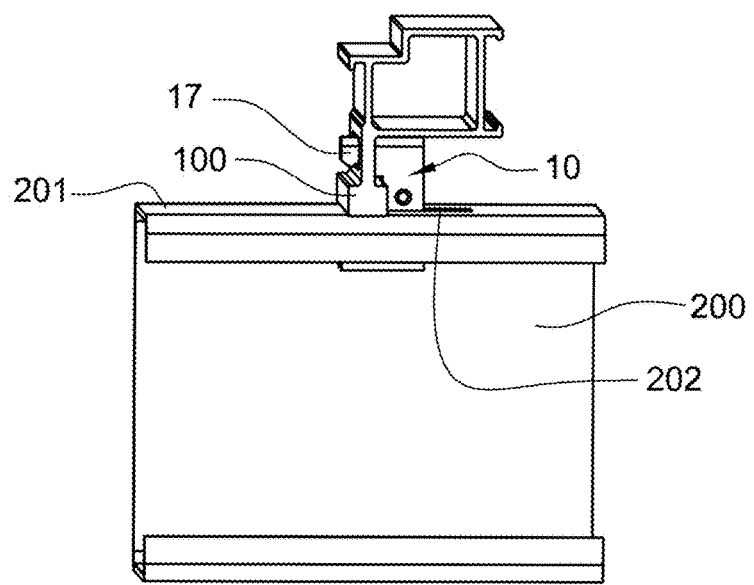
Figure 10:
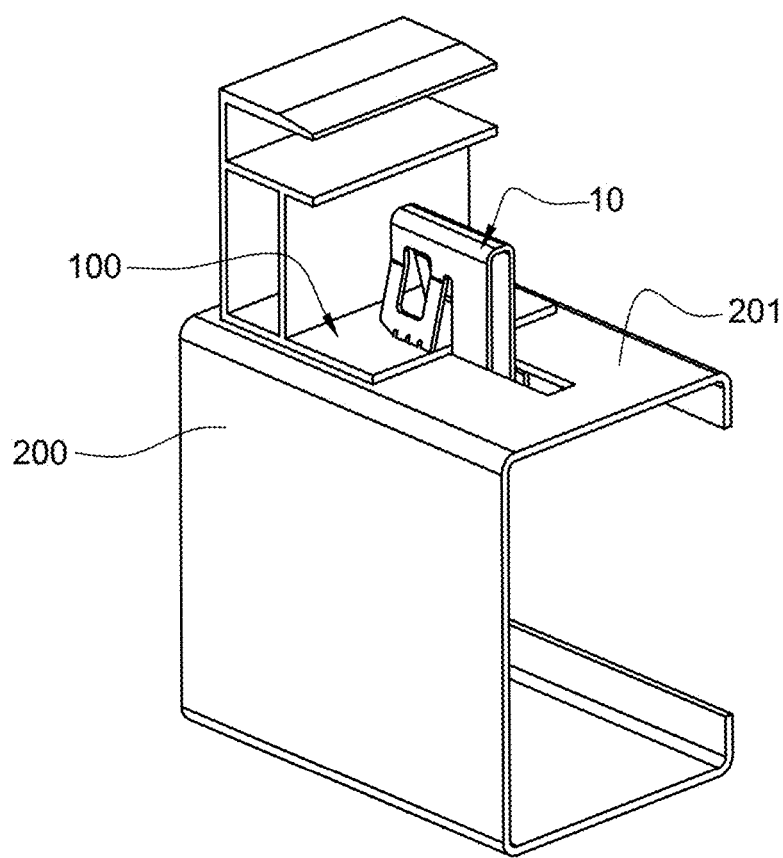
FIG. 10 shows the fastening staple of FIGS. 7 to 9, after sliding so as to occupy a state where it ensures holding of a photovoltaic framework.

For example, FIGS. 5 and 6 for the first example of a fastening staple 10 and FIG. 10 for the second example of a fastening staple 10 illustrate the situation obtained on completion of a transverse sliding movement of the fastening staple 10 brought until jointly placing a segment of the support wall 201 and a photovoltaic fame 100 segment inside the jaw 15, that is to say between the bearing head 11 and the counter-support foot 12.

In each of the six examples of a fastening staple 10, the counter-support foot 12 comprises at least one bearing lateral flange 16 positioned longitudinally so as to bear longitudinally against a rear face of the support wall 201 when the photovoltaic framework 100 and the support wall 201 are transversely engage d in the jaw 15. The bearing of said at least one bearing lateral flange 16 against the rear face of the support wall 201 is shown in FIG. 3.

In each of the six examples of a fastening staple 10, the bearing head 11 comprises at least one hooking element 17 adapted to hook the photovoltaic framework 100 in order to transversely immobilize the photovoltaic framework 100 in the jaw 15 once the segment of the support wall 201 and the photovoltaic framework 100 segment have been jointly placed inside the jaw 15 by transverse sliding of the fastening staple 10.

Amongst others, the first and second examples of a fastening staple 10 differ from each other in the manner in which the hooking element 17 is organized. These arrangements will be detailed later on.

In each of the six examples of a fastening staple 10, the latter comprises at least one mechanical tensioning flange where an elastic deformation and/or a displacement thereof, resulting from the action of transverse engagement of the photovoltaic framework 100 segment and of the support wall 201 segment in the determined interval 14 between the bearing head 11 and the counter-support foot 12, enables the bearing head 11 and the counter-support foot 12 to exert a longitudinal tightening of the photovoltaic framework 100 and of the support wall 201 in the jaw 15.

The first and second examples of a fastening staple 10 also differ from each other in the manner in which said at least one mechanical tensioning flange is organized. These arrangements will be detailed later on.

According to a particular non-limiting embodiment, implemented by each of the six examples of a fastening staple 10 represented in FIGS. 1 to 14, the linking body 13 is constituted by two lateral walls 18 delimited by the fastening staple 10, shifted from each other in the lateral direction Y of the fastening staple 10 and connected to each other at one of their longitudinal ends at the bearing head 11 by a folding area 19. On the contrary, the opposite longitudinal ends of two lateral walls 18 are independent of each other at the counter-support foot 12. Said at least one bearing lateral flange 16 is secured to one of the lateral walls 18 so as to extend laterally in projection with respect to the latter.

These technical arrangements guarantee that the fastening staple 10 has the advantage of being simple to manufacture and therefore of being economical, of enabling a proper lateral bearing of the flanges 16, 26 and of offering a very high resistance to both tearing out according to the longitudinal direction X and to shear according to the lateral direction Y.

In particular, each fastening staple 10 may comprise two bearing lateral flanges 16 respectively secured to two lateral walls 18 at the counter-support foot 12. For example, each bearing lateral flange 16 is arranged in the continuation of the end of the lateral wall 18 to which it is secured by being connected thereto by a folding area.

In each of the six examples of a fastening staple 10, the bearing head 11 comprises an upper arm 20 extending transversely in a cantilevered manner from the folding area 19 and directly below the counter-support foot 12 in the longitudinal direction X. Thus, the jaw 15 adopts a U-like general shape in the plane (X, Z), whose bottom is materialized by the linking body 13 which links the bearing head 11 and the counter-support foot 12.

In the first example of a fastening staple 10, the hooking element 17 comprises a retaining lug 171 and a shoulder 172 secured to the upper arm 20 while being shifted from each other in the transverse direction Z along the upper arm 20, and delimiting therebetween a notch 173 which opens onto the inside of the jaw 15 and adapted to receive a rib 101 of the photovoltaic framework 100, typically secured to the structural frame.

Still in the first example of a fastening staple 10, said at least one mechanical tensioning flange is constituted by said at least one bearing lateral flange 16. Each bearing lateral flange 16 is inclined so as to form an angle with respect to the lateral direction Y and is connected to the lateral wall 18 to which it is secured by an elastically-deformable curved area 21 such that the bearing lateral flange 16 is likely to come down longitudinally, at least by elastic deformation of this elastically-deformable curved area 21 and even by intrinsic elastic deformation of the bearing lateral flange 16, under the action of the transverse engagement of the photovoltaic framework 100 segment and of the support wall 201 segment in the determined interval 14 between the bearing head 11 and the counter-support foot 12.

In the first example of a fastening staple 10, the lateral walls 13 are inclined so as to form an angle with the longitudinal direction X to get close to each other by getting close to the folding area 19. The folding area 19 has some elasticity such that the lateral walls 18 are likely to laterally approach each other, by elastic deformation of the folding area 19, the elastic return of the material of the folding area 19 ensuring a lateral return of the lateral walls 18 outwardly in the lateral direction Y.

A first function of this lateral spacing of the lateral walls 13 for an elastic return towards the outside is to enable them to get close to each other during the insertion of the fastening staple 10 through the slot 202, the folding area 19 serving to impart an outer lateral return of the lateral walls 18 towards the edges of the slot 202. More generally, the possibility of elastic displacement of the lateral walls 18 possibly accompanied, when this is possible as is the case in the example of FIG. 1, 12 or 13, by a possibility of elastic displacement of the bearing lateral flanges 16, creates and overall elasticity and imparts a return in the longitudinal direction X which is very useful: not only these displacement possibilities facilitate the set-up of a segment of the support wall 201 and of a photovoltaic framework 100 segment in the jaw delimited between the bearing head 11 and the counter-support foot 12 at mounting by sliding of the fastening staple 10 in the transverse direction Z by modifying the determined interval 14, but this also allows increasing the elasticity of the fastening staple 10 (lower stiffness, larger elastic deformation) in the longitudinal direction X as well as the range of thickness of the support wall 201 and of the framework 100 tolerated by a fastening staple 10. This ultimately allows increasing the versatility of the fastening staple 10 and dampening the resonance vibrations of the photovoltaic panel 100.

In each of the six examples of a fastening staple 10 illustrated in FIGS. 1 to 12, the fastening staple 10 comprises retaining elements configured so as to prevent the fastening staple 10 from being longitudinally removed out of the slot 202, for example under the simple effect of gravity, after its longitudinal insertion, in order to ensure a positive blockage of the fastening staple 10 in the configuration in which the bearing head 11 and the counter-support foot 12 are respectively on either side of the support wall 201. By positive blockage, it should herein be understood that the fastening staple 10 remains longitudinally blocked in the slot 202, after insertion, as long as no human action tending to release the fastening staple 10 is applied.

In the first example of a fastening staple 10, the retaining elements are in the form of a holding lateral projection 22 formed, for example by stamping, in each of the lateral walls 18 so as to be likely to abut against the front face of the support wall 201 at the edges of the slot 212, after the longitudinal insertion of the bearing head 11 throughout the thickness of the slot 202. The same applies to the examples of FIGS. 12 and 13.

Now in the second example of a fastening staple 10, the bearing head 11 comprises two flexible flanges 23 independent of each other where each flexible flange 23 is connected to the upper arm 20 by a folded area 24 so as to extend each towards the counter-support foot 12 in an inclined manner by forming an angle with the longitudinal direction X. The two flexible flanges 23 converge towards each other by getting close to the upper arm 20. Each flexible flange 23 is likely to be separated laterally, by elastic deformation of the folded area 24 and/or by intrinsic elastic deformation of the flexible flange 23, under the action of the transverse engagement of the photovoltaic framework 100 segment and of the support wall 201 segment in the determined interval 14 between the bearing head 11 and the counter-support foot 12. The same applies to the example of FIG. 14.

In the second and sixth examples of a fastening staple 10 of FIGS. 7 and 14, said at least one mechanical tensioning flange is constituted by the two flexible flanges 23. The flexible flanges 23 also constitute the previously-defined retaining elements, advantageously making unnecessary the presence of the holding lateral projections 22 in contrast with the examples of a fastening staple 10 of FIGS. 1, 12 and 13 for the manufacturing simplicity and cost reasons.

Each flexible flange 23 may be perforated, as illustrated, in order to improve its elastic deformation capabilities.

Regardless of the manner in which said at least one mechanical tensioning flange is constituted, its presence allows ensuring a holding of the photovoltaic framework 100 stressed against the front face of the support wall 201. Besides the advantages related to the mechanical resistance of the obtained fastening, this makes reliable the setting at the same electric potential of the photovoltaic framework 100 and of the support wall 201 conferred by the intrinsic electrical conduction characteristics of the fastening staple 10.

Still in the second and sixth examples of a fastening staple 10 of FIGS. 7 and 14, the hooking element 17 comprises a series of hooking teeth 174 transversely staggered along a distal edge of the flexible flange 23 opposite to its proximal edge linked to the folded area 24. The hooking teeth 174 are adapted to cut into the photovoltaic framework 100 segment under the action of the transverse engagement of the photovoltaic framework 100 segment in the determined interval 14 between the bearing head 11 and the counter-support foot 12.

Thus, the determined interval 14 then corresponds to the space between the hooking teeth 174 and the bearing lateral flanges 16. This determined interval 14 is much smaller than in the case of the first example of a fastening staple 10, making it for example adapted for the engagement of a photovoltaic framework 100 segment in the form of a planar base in contrast with the case of the first example where the photovoltaic framework 100 segment has the aforementioned rib 101.

In each of the first example and second example of a fastening staple 10, each lateral wall 18 has, at the linkage between the linking body 13 and the counter-support foot 12 which, in turn, is cantilevered transversely with respect to the counter-support foot 12, an inclined edge forming an angle with respect to the transverse direction Z in order to limit the inner stresses to which the fastening staple 10 is subjected in this area, in order to avoid as much as possible the risks of breakage of this area.

Referring to FIG. 11, the third example of a fastening staple 10 differs from the second example in that the linking body 13 delimits at least one imprint 25 adapted to receive and hold a complementary portion of an applicator (not represented) independent of the fastening staple 10 where said applicator has a capacity of serving as a martyr wedge for the implementation of the overall sliding movement of the fastening staple 10 in the transverse direction Z by hitting on the applicator, typically thanks to a hammer. For example, such an imprint 25 may be obtained by a lateral inflection in the form of a recess formed in each lateral wall 18 in a given area of its height.

Alternatively, it is possible to provide for a mounting by means of a suitable tool inserted not by the top of the plane of the support wall 201 in the direction X but from the bottom thereof. The tool may be quite simple, for example in the form of a plate folded at a right angle one end of which features a slot having a width substantially equal to the width of the slot 202. The insertion in the transverse direction Z of the fastening staple 10 in this tool participates in compressing the lateral walls 18 until they touch each other and then facilitates not only the insertion of the fastening staple 10 in the support wall 201 in the longitudinal direction X but also the insertion of the fastening staple 10 in the transverse direction Z on the support wall 201 segment and the photovoltaic framework 100 segment superimposed on each other. By removing the tool in the direction Z in the reverse direction of mounting, which is made possible either by hooking of the hooking element 17 which retains the fastening staple 10 relative to the photovoltaic framework 100, the elastic tightening in the transverse direction Z of the support wall 201 and of the photovoltaic framework 100 is established. The fastening staple 10 of FIGS. 12 and 13 are very suited to this method, because the elastically-deformable curved area 21 which is set back in the direction Y with respect to the counter-support foot 12.

In turn, the fourth example of a fastening staple 10, which is represented in FIG. 12, is a variant of the first example represented in FIGS. 1 to 6. The fastening staple 10 of FIG. 12 differs from the fastening staple 10 in the manner in which each of the bearing lateral flanges 16 are formed. Indeed, in FIG. 12, it may be noticed that each of the bearing lateral flanges 16 is split in the transverse direction Z into at least one upper bearing lateral flanges 161 and into at least one lower bearing lateral flange 162. As example, as represented in FIG. 12, each bearing lateral flange 16 is transversely split into one single upper bearing lateral flange 161 and into two lower bearing lateral flanges 162, the upper bearing lateral flange 161 being for example located between the two lower bearing lateral flanges 162 in the transverse direction Z. The angle formed by said at least one upper bearing lateral flange 161 with respect to the lateral direction Y is larger than the angle formed by said at least one lower bearing lateral flange 162 with respect to the lateral direction Y. The difference between these angles is typically adjusted by a control of the elastically-deformable curved area 21 which links each of the upper and lower bearing lateral flanges 161, 162 to the lateral wall 18. Thus, said at least one upper bearing lateral flange 161 projects upwards (that is to say on the bearing head 11 side), in the longitudinal direction X, with respect to said at least one lower bearing lateral flange 162. Consequently, at the time of transverse engagement of the photovoltaic framework 100 segment and of the support wall 201 segment in the determined interval 14 between the bearing head 11 and the counter-support foot 12, said at least one upper bearing lateral flange 161 will bear against the lower face of the support wall 201, causing a longitudinal lowering of said at least one upper bearing lateral flange 161 at least by elastic deformation of the elastically-deformable curved area 21 and even by intrinsic elastic deformation of the upper bearing lateral flange 161, even before the establishment of a contact between said at least one lower bearing lateral flange 162 and the lower face of the support wall 201.

Under normal conditions of use where only a holding of the photovoltaic framework 100 is looked for together with the setting at the same electric potential between the photovoltaic framework 100 and the support wall 201, only said at least one upper bearing lateral flange 161 is in contact with the rear face of the support wall 201 and serves as a mechanical tensioning flange. On the contrary, under exceptional conditions of use where the photovoltaic framework 100 held in this manner is subjected to very high external forces, for example in the event of strong winds, promoting a raising of the photovoltaic framework 100 relative to the support wall 201, this results in the application of very high forces (much higher than those during the presence of the aforementioned normal conditions of use) of the photovoltaic framework 100 on the fastening staple 10, these forces tending to longitudinally raise the fastening staple 10 relative to the support wall 201 being transmitted by the fastening staple 10 to the support wall 201 via the counter-support foot 12. During these exceptional conditions of use, said at least one lower bearing lateral flange 162 gets into contact against the rear face of the support wall 201, in addition to each upper bearing lateral flange 161 already in contact. This leads to a longitudinal lowering of each lower bearing lateral flange 162 at least by elastic deformation of the elastically-deformable curved area 21 and even by intrinsic elastic deformation of the lower bearing lateral flange 162.

Thus, in the fourth example of FIG. 12, the fastening staple 10 comprises two longitudinal stiffness levels applicable by the jaw 15. A first longitudinal stiffness level is exerted by said at least one upper bearing lateral flange 161. This first stiffness level is lower than the longitudinal stiffness exerted by the jaw 15 in the case of the first example, because said at least one upper bearing lateral flange 161 has a capacity to be folded and/or deformed which is higher than that of each integral baring lateral flange 16 used in the fastening staple 10 of FIG. 1. The second stiffness lever is higher than the first level and is exerted by the combination of said at least one upper bearing lateral flange 161 and said at least one lower lateral flange 162. In this advantageous organization, said at least one upper bearing lateral flange 161 and said at least one lower bearing lateral flange 162 are considered as part of the constitution of said at least one mechanical tensioning flange comprised by the fastening staple 10.

In turn, the sixth example of a fastening staple 10, which is represented in FIG. 13, is a variant of the fourth example represented in FIG. 12. It differs from the later firstly by the fact that in contrast with the examples of a fastening staple shown in FIGS. 1 and 12 where the length of the bearing head 11 and the length of the counter-support foot 12 in the transverse direction Z are substantially equal, the length of the counter-support foot 12 considered in the transverse direction Z is herein larger, for example by 10 to 30%, than the transverse length of the bearing head 11. This allows preventing even better the risks of peeling off of the fastening staple 10 out of the support wall 201 should the support wall 201 get away. Another difference between the example of FIG. 13 and that of FIG. 12 consists in the arrangement of the upper bearing lateral flange 161 and of the lower bearing lateral flange 162. Indeed, in the example of FIG. 13, each of the bearing lateral flanges 16 is split in the transverse direction Z into one single upper bearing lateral flange 161 and into one single lower bearing lateral flange 162, the upper bearing lateral flange 161 being completely arranged at the front, that is to say opposite to the bottom of the jaw.

In turn, the sixth example of a fastening staple 10, which is represented in FIG. 14, is a variant of the second example represented in FIG. 7. It differs from the latter in that in contrast with the example of a fastening staple 10 shown in FIG. 7 where the length of the bearing head 11 and the length of the counter-support foot 12 in the transverse direction Z are substantially equal, the length of the counter-support foot 12 considered in the transverse direction Z is herein larger, for example by 10 to 30%, than the transverse length of the bearing head 11. This allows preventing even better the risks of peeling off of the fastening staple 10 out of the support wall 201 should the support wall 201 get away.

The invention also relate to a photovoltaic installation comprising at least one photovoltaic framework 100, at least one support wall 201 delimiting a front face against which bears the photovoltaic framework 100 and in which is formed at least one slot 202, and at least one such fastening staple 10 as previously described inserted into the slot 202. This insertion of the fastening staple 10 is such that the linking body 13 crosses the thickness of the support wall 201 through the slot 202 to position the bearing head 11 and the counter-support foot 12 respectively on either side of the support wall 201. Afterwards, the fastening staple 10 is slid along the slot 202 by an overall sliding movement of the fastening staple 10 in the transverse direction Z of the fastening staple 10 to transversely engage both a segment of the support wall 201 and a segment of the photovoltaic framework 100 in the determined interval 14 between the bearing head 11 and the counter-support foot 12.

Each fastening staple 10 described in this document is economical, promotes an easy mounting, allows installations on non-flat terrains, and is very robust to tearing out and to shear.

The slots 202, by adjustment of the position occupied by the fastening staple 10 along the slot 202 in which it is mounted, advantageously enable a first possibility of setting the position occupied by the photovoltaic framework 100 with respect to the support wall 201 according to a first direction, typically oriented according to an East-West axis. At the same time, each fastening staple 10 offers a second possibility of setting the position occupied by the photovoltaic framework 100 with respect to the support wall 201 according to a second direction, typically oriented according to a North-South axis, by adjustment of the position occupied by the photovoltaic framework 100 with respect to the bearing head 11 in the lateral direction Y of the fastening staple 10. These two possibilities of independent and combinable settings considerably facilitate the operations of mounting the photovoltaic installation and advantageously makes it possible to arrange photovoltaic installations on non-flat terrains.

An additional advantage is that the set described in the present document operates with a slot 202 having a very small width, for example comprised between 5 and 7 mm. Indeed, the presence of a slot 202 with a small width allows avoiding reducing too considerably the resistance of the supporting beam 200 which delimits the support wall 201, ultimately allowing advantageously keeping the production costs competitive for the supporting beam 200 of the installation.

The invention claimed is:

1. A fastening staple adapted for fastening of a photovoltaic framework against a front face of a support wall, the fastening staple consisting of an electrically-conductive metallic part integrally made in one piece shaped so as to delimit:
   a bearing head;
   a counter-support foot;
   a linking body linking the counter-support foot to the bearing head so that the bearing head and the counter-support foot are shifted from each other along a longitudinal direction (X) of the fastening staple by a determined interval, the linking body being adapted to cross the thickness of the support wall through a slot formed in the support wall, by longitudinal insertion of the bearing head through the slot so as to position the bearing head and the counter-support foot respectively on either side of the support wall, and to slide along the slot by an overall sliding movement of the fastening staple in a transverse direction (Z) of the fastening staple;
- wherein the determined interval between the bearing head and the counter-support foot is adapted such that the bearing head and the counter-support foot constitute a jaw likely to transversely receive both a segment of the support wall and a segment of the photovoltaic framework in a configuration where the photovoltaic framework bears against the front face of the support wall,
- wherein the counter-support foot comprises at least one bearing lateral flange positioned longitudinally so as to bear longitudinally against a rear face of the support wall when the photovoltaic framework and the support wall are transversely engaged in the jaw,
- wherein the bearing head comprises at least one hooking element adapted to hook the photovoltaic framework in order to transversely immobilize the photovoltaic framework in the jaw,
- wherein the bearing head and/or the counter-support foot comprises at least one mechanical tensioning flange where an elastic deformation and/or a displacement thereof, resulting from the action of transverse engagement of the photovoltaic framework segment and of the support wall segment in the determined interval between the bearing head and the counter-support foot, enables the bearing head and the counter-support foot to exert a longitudinal tightening of the photovoltaic framework and of the support wall in the jaw,
- wherein the linking body is constituted by two lateral walls delimited by the fastening staple, shifted from each other in a lateral direction (Y) of the fastening staple and connected to each other at one of their longitudinal ends at the bearing head by a folding area, their opposite longitudinal ends being independent of each other at the counter-support foot, said at least one bearing lateral flange being secured to one of the lateral walls so as to extend laterally in projection with respect to the lateral wall to which it is secured.

2. The fastening staple according to claim 1, wherein the bearing head comprises an upper arm extending transversely in a cantilevered manner from the folding area and directly below the counter-support foot in the longitudinal direction (X).

3. The fastening staple according to claim 1, wherein said at least one mechanical tensioning flange is constituted by said at least one bearing lateral flange and in that said at least one bearing lateral flange is inclined so as to form an angle with respect to the lateral direction (Y) and is connected to the lateral wall to which it is secured by an elastically-deformable curved area such that the bearing lateral flange is likely to come down longitudinally, at least by elastic deformation of said elastically-deformable curved area, under the action of the transverse engagement of the photovoltaic framework segment and of the support wall segment in the determined interval between the bearing head and the counter-support foot.

4. The fastening staple according to claim 3, wherein each of the bearing lateral flanges is split in the transverse direction (Z) into at least one upper bearing lateral flange and into at least one lower bearing lateral flange, said at least one upper bearing lateral flange projecting on the bearing head side, in the longitudinal direction (X), with respect to said at least one lower bearing lateral flange.

5. The fastening staple according to claim 3, wherein the hooking element comprises a retaining lug and a shoulder secured to the upper arm while being shifted from each other in the transverse direction (Z) along the upper arm, and delimiting therebetween a notch which opens onto the inside of the jaw and adapted to receive a rib of the photovoltaic framework.

6. The fastening staple according to claim 3, wherein the lateral walls are inclined so as to form an angle with the longitudinal direction (X) so as to get close to each other by getting close to the folding area, the lateral walls being likely to laterally approach each other by elastic deformation of the folding area, the elastic return of the material of the folding area ensuring a lateral return of the lateral walls outwardly in the lateral direction (Y).

7. The fastening staple according to claim 6, wherein each lateral wall comprises a holding lateral projection likely to abut against the front face of the support wall, at the edges of the slot, after the longitudinal insertion of the bearing head through the slot.

8. The fastening staple according to claim 2, wherein the bearing head comprises two flexible flanges independent of each other where each flexible flange is connected to the upper arm by a folded area so as to extend each towards the counter-support foot in an inclined manner by forming an angle with the longitudinal direction (X), the two flexible flanges converging towards each other by getting close to the upper arm, each flexible flange being likely to be separated laterally, by elastic deformation of said folded area and/or by intrinsic elastic deformation of the flexible flange, under the action of the transverse engagement of the photovoltaic framework segment and of the support wall segment in the determined interval between the bearing head and the counter-support foot and in that said at least one mechanical tensioning flange is constituted by the two flexible flanges.

9. The fastening staple according to claim 8, wherein the hooking element comprises a series of hooking teeth transversely staggered along a distal edge of the flexible flange opposite to its proximal edge linked to the folded area, the hooking teeth being adapted to cut into the photovoltaic framework segment under the action of the transverse engagement of the photovoltaic framework segment in the determined interval between the bearing head and the counter-support foot.

10. The fastening staple according to claim 2, wherein said at least one mechanical tensioning flange is constituted by said at least one bearing lateral flange and in that said at least one bearing lateral flange is inclined so as to form an angle with respect to the lateral direction (Y) and is connected to the lateral wall to which it is secured by an elastically-deformable curved area such that the bearing lateral flange is likely to come down longitudinally, at least by elastic deformation of said elastically-deformable curved area, under the action of the transverse engagement of the photovoltaic framework segment and of the support wall segment in the determined interval between the bearing head and the counter-support foot.

11. The fastening staple according to claim 10, wherein each of the bearing lateral flanges is split in the transverse direction (Z) into at least one upper bearing lateral flange and into at least one lower bearing lateral flange, said at least one upper bearing lateral flange projecting on the bearing head side, in the longitudinal direction (X), with respect to said at least one lower bearing lateral flange.

12. The fastening staple according to claim 10, wherein the hooking element comprises a retaining lug and a shoulder secured to the upper arm while being shifted from each other in the transverse direction (Z) along the upper arm, and delimiting therebetween a notch which opens onto the inside of the jaw and adapted to receive a rib of the photovoltaic framework.

13. The fastening staple according to claim 11, wherein the hooking element comprises a retaining lug and a shoulder secured to the upper arm while being shifted from each other in the transverse direction (Z) along the upper arm, and delimiting therebetween a notch which opens onto the inside of the jaw and adapted to receive a rib of the photovoltaic framework.

14. The fastening staple according to claim 10, wherein the lateral walls are inclined so as to form an angle with the longitudinal direction (X) so as to get close to each other by getting close to the folding area, the lateral walls being likely to laterally approach each other by elastic deformation of the folding area, the elastic return of the material of the folding area ensuring a lateral return of the lateral walls outwardly in the lateral direction (Y).

15. The fastening staple according to claim 4, wherein the lateral walls are inclined so as to form an angle with the longitudinal direction (X) so as to get close to each other by getting close to the folding area, the lateral walls being likely to laterally approach each other by elastic deformation of the folding area, the elastic return of the material of the folding area ensuring a lateral return of the lateral walls outwardly in the lateral direction (Y).

16. The fastening staple according to claim 5, wherein the lateral walls are inclined so as to form an angle with the longitudinal direction (X) so as to get close to each other by getting close to the folding area, the lateral walls being likely to laterally approach each other by elastic deformation of the folding area, the elastic return of the material of the folding area ensuring a lateral return of the lateral walls outwardly in the lateral direction (Y).

17. The fastening staple according to claim 11, wherein the lateral walls are inclined so as to form an angle with the longitudinal direction (X) so as to get close to each other by getting close to the folding area, the lateral walls being likely to laterally approach each other by elastic deformation of the folding area, the elastic return of the material of the folding area ensuring a lateral return of the lateral walls outwardly in the lateral direction (Y).

18. The fastening staple according to claim 14, wherein each lateral wall comprises a holding lateral projection likely to abut against the front face of the support wall, at the edges of the slot, after the longitudinal insertion of the bearing head through the slot.

19. The fastening staple according to claim 15, wherein each lateral wall comprises a holding lateral projection likely to abut against the front face of the support wall, at the edges of the slot, after the longitudinal insertion of the bearing head through the slot.

20. The fastening staple according to claim 16, wherein each lateral wall comprises a holding lateral projection likely to abut against the front face of the support wall, at the edges of the slot, after the longitudinal insertion of the bearing head through the slot.

* * * * *